(12) United States Patent
Ichinose et al.

(10) Patent No.: US 6,611,063 B1
(45) Date of Patent: Aug. 26, 2003

(54) RESIN-ENCAPSULATED SEMICONDUCTOR DEVICE

(75) Inventors: Michihiko Ichinose, Tokyo (JP);
Tomoko Takizawa, Tokyo (JP);
Hirokazu Honda, Tokyo (JP);
Keiichirou Kata, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 114 days.

(21) Appl. No.: 09/664,061

(22) Filed: Sep. 18, 2000

(30) Foreign Application Priority Data

Sep. 16, 1999 (JP) .............................. 11-261959
Jun. 20, 2000 (JP) ........................... 2000-184151

(51) Int. Cl.⁷ .................. H01L 23/48; H01L 23/52; H01L 29/40
(52) U.S. Cl. .................. 257/784; 257/222; 257/686
(58) Field of Search ................. 257/784, 786, 257/783, 778, 686, 777, 787

(56) References Cited

U.S. PATENT DOCUMENTS

| | | | |
|---|---|---|---|
| 5,592,025 A | | 1/1997 | Clark et al. |
| 5,726,489 A | * | 3/1998 | Matsuda et al. |
| 5,729,432 A | | 3/1998 | Shim et al. |
| 5,793,106 A | | 8/1998 | Yasukawa et al. |
| 5,837,567 A | | 11/1998 | Tanaka et al. |
| 5,847,455 A | | 12/1998 | Manteghi |
| 5,874,784 A | * | 2/1999 | Aoki et al. |
| 5,905,303 A | * | 5/1999 | Kata et al. |
| 5,990,545 A | * | 11/1999 | Schueller et al. |
| 5,990,546 A | * | 11/1999 | Igarashi et al. |
| 6,025,650 A | * | 2/2000 | Tsuji et al. |
| 6,204,564 B1 | * | 3/2001 | Miyata et al. |
| 6,316,838 B1 | * | 11/2001 | Ozawa et al. |
| 6,330,166 B1 | * | 12/2001 | Aoyama et al. |
| 6,340,606 B1 | * | 1/2002 | Hashimoto et al. |

FOREIGN PATENT DOCUMENTS

| | | |
|---|---|---|
| EP | 0 582 052 A1 | 2/1994 |
| JP | A 2-151496 | 6/1990 |
| JP | 2-240940 | 9/1990 |
| JP | 9-283925 | 10/1997 |
| JP | 10-116935 | 5/1998 |
| JP | 10-284544 | 10/1998 |
| JP | 11-195733 | 7/1999 |
| KR | A 1999-0037053 | 5/1999 |
| WO | WO 95/26047 | 9/1995 |

* cited by examiner

*Primary Examiner*—Sheila V. Clark
(74) *Attorney, Agent, or Firm*—Young & Thompson

(57) ABSTRACT

A method for forming a mold-encapsulated semiconductor device includes the steps of mounting a semiconductor chip on a metallic plate having a metallic interconnect pattern thereon, encapsulating the semiconductor chip on the metallic interconnect pattern, removing the bottom of the metallic plate by etching to expose the metallic interconnect pattern, and forming external terminals on the bottom of the metallic interconnect pattern. The method reduces the thickness as well as the planar dimensions of the semiconductor device.

1 Claim, 15 Drawing Sheets

RESIN-ENCAPSULATED SEMICONDUCTOR DEVICE

FIELD OF THE INVENTION

The present invention relates to a resin-encapsulated semiconductor device and, more particularly to the structure of the resin-encapsulated semiconductor device suited to a ball-grid-array (BGA) semiconductor device. The present invention also relates to a method for fabricating such a semiconductor device.

DESCRIPTION OF RELATED ART

For reduction of dimensions of semiconductor devices, BGA semiconductor devices have been increasingly used these days. FIG. 1 shows the structure of a conventional BGA semiconductor device, wherein a semiconductor chip 31 is mounted on a central area of an interposer substrate 32, and fixed to the interposer substrate 32 with the bottom surface of the semiconductor chip 31 being adhered thereto. The interposer substrate 32 is made of an organic insulating substance such as polyimide, glass epoxy, BT resin etc, on which a metallic interconnect pattern or bonding pad 34 made of Cu, for example, is provided.

The interposer substrate 32 has a plurality of bonding pads 34 in the vicinity of the outer periphery thereof, i.e., outside the area for mounting the semiconductor chip 31. The inner side 35 of the bonding pad 34 is called stitch area and used for connection with a bonding wire 40, whereas the outer side 36 of the bonding pad 34 is called land area on which a solder ball 38 is formed. The organic insulator 37 of the interposer substrate 32 has an opening for the land area 36, on the bottom surface of which the solder ball 38 is formed. The solder ball 38 is used as an external terminal by an end user for mounting the semiconductor device on a printed circuit board.

The mounting of the semiconductor chip 31 onto the interposer substrate 32 is conducted as follows. First, a specified amount of adhesive 33 is dropped onto a specified position of the interposer substrate 32 from a multi-nozzle coater, then a semiconductor chip 31 is mounted thereto, and the adhesive 33 is cured by heating to fix the semiconductor chip 31 onto the interposer substrate 32. Subsequently, Al chip electrodes 39 and the stitch area 35 of the bonding pads 34 are electrically connected together by a wire bonding technique using bonding wires 40 made of Au or Cu. Thereafter, the top surface of the interposer substrate 32 together with the semiconductor chip 31 is encapsulated by a transfer molding technique using a mold resin 41 containing therein an epoxy resin as a main component thereof, whereby the semiconductor chip 31 is protected against mechanical damages thereof and ingress of moisture.

Subsequently, solder balls 38 constituting external terminals are formed on the bottom surfaces of the land areas 36 of the bonding pads 34 on the interposer substrate 32. In this step, flux is applied onto the land areas 36 beforehand, then the solder balls 38 are placed onto the land areas 36, followed by thermal reflow of the solder ball 38 to form the external terminals 38 therefrom. The external terminals 38 are made of solder including tin and lead as the main components thereof, for example.

In the conventional BGA semiconductor device as to described above, the two layer structure of the interposer substrate including the organic insulator and the metallic interconnect pattern prevents a reduction of the thickness of the BGA semiconductor device having the interposer substrate.

Each of Patent Publications JP-A-2-240940, -10-116935 and -11-195733 describes a technique for reducing the thickness of the semiconductor device by polishing the interposer substrate made of resin at the bottom surface thereof.

In the described technique, there is a drawback in which an electrolytic plating technique which allows formation of a metallic interconnect layer having a higher impurity is difficult to use on the resin interposer substrate. Although there is some technique wherein an electrolytic plating technique can be used on the resin substrate by providing an electrode film on the resin substrate, the electrode film must extend to the outer periphery of the resin substrate and thus forms the metallic interconnect pattern at the outer periphery where the metallic interconnect pattern is not needed.

In addition, in the conventional semiconductor device, after the arrangement of the stitch areas for the bonding wires is determined, the locations of the land areas for the bonding pads are determined accordingly at the outside of the stitch areas. This imposes a large restriction on the arrangement of the external terminals, and causes an obstacle against the reduction of the planar dimensions of the electronic appliances or electronic parts mounting thereon the semiconductor device.

In particular, it is requested to reduce the pitch of the external terminals in the semiconductor device along with the recent reduction of the dimensions of the electronic appliances and parts. In this respect, although the pitch reduction for the bonding pads has been achieved to some extent in the metallic interconnect pattern due to the development of the photolithographic technique, the pitch reduction for the external terminals has not been successful due to the large space needed for formation of the solder ball.

SUMMARY OF THE INVENTION

It is therefore an object of the present invention to solve the above problem and to reduce the costs and the dimensions of a BGA semiconductor device by improving the structure of the conventional BGA semiconductor device to reduce the overall dimensions thereof and to form a metallic interconnect pattern having an excellent connection capability at a desired position.

The present invention provides, in a first aspect thereof, a semiconductor device including a semiconductor chip having chip electrodes thereon, a metallic interconnect pattern having a top surface connected to the chip electrodes and supporting the semiconductor chip, at least the top surface of the metallic interconnect pattern being formed by an electrolytic plating technique, a insulating film covering a bottom surface of the metallic interconnect pattern and having through-holes therein, a plurality of external terminals formed on the bottom surface of the interconnect pattern in the through-holes, and a mold resin encapsulating the semiconductor chip on the top surface of the metallic interconnect pattern and the insulating film.

In accordance with the semiconductor device of the present invention, by employing a structure wherein only a thin insulator film and an electrolytic-plated interconnect pattern are formed on the bottom surface of the semiconductor chip, the overall thickness of the semiconductor device can be reduced compared to the conventional semiconductor device having the interposer substrate.

In addition, the electrolytic-plated interconnect pattern has an improved reliability, thereby allowing improvements in quality and reduction of dimensions and costs for the electronic appliances and parts mounting thereon the semiconductor device.

The present invention also provides, in a second aspect thereof, a method for forming a semiconductor device including the steps of forming a frame substrate having a metallic plate and a metallic interconnect pattern formed on a top surface of the metallic plate, mounting a semiconductor chip on the interconnect pattern, encapsulating the semiconductor chip on the frame substrate by a mold resin, and removing at least a part of the metallic plate at a bottom surface thereof to expose at least a part of the metallic interconnect pattern.

In accordance with the method of the present invention, the process of removing the metallic plate of the frame substrate to expose the interconnect pattern after encapsulating the semiconductor chip by a mold resin assures an excellent rigidity of the semiconductor device before the encapsulation and reduces the overall thickness of the semiconductor device after the encapsulation.

PREFERRED EMBODIMENTS OF THE INVENTION

Figure 1:
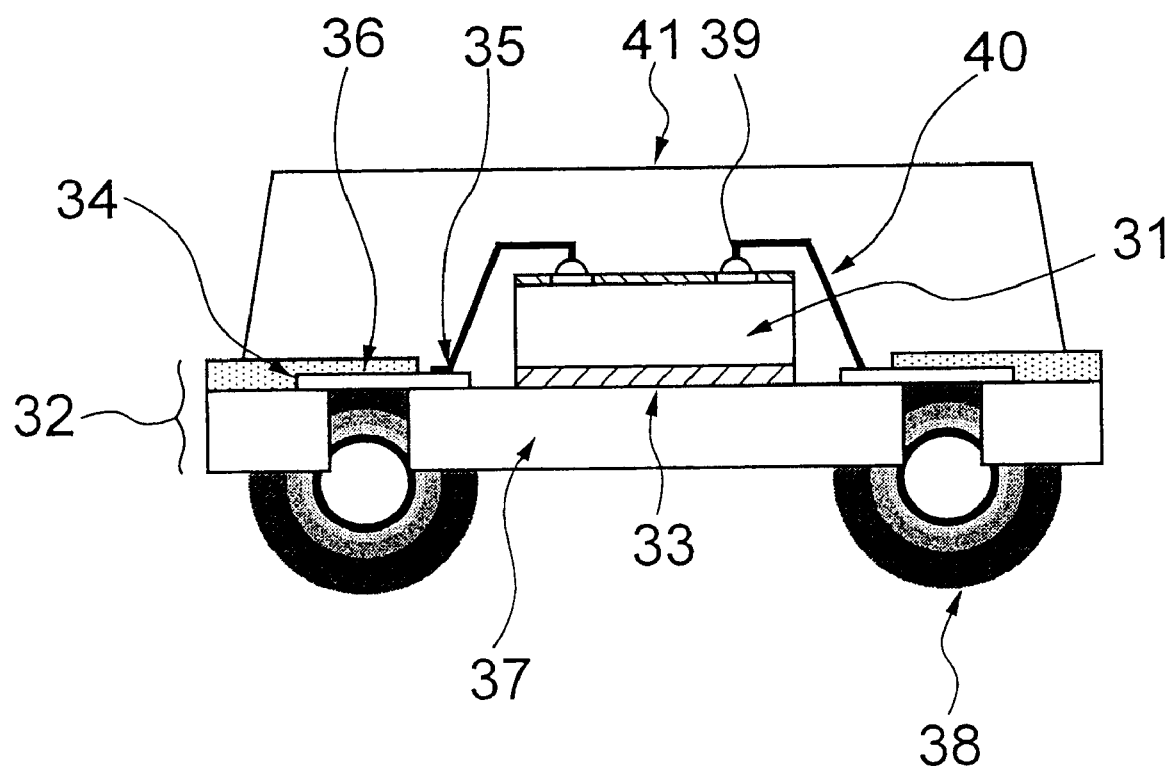
FIG. 1 is a sectional view of a conventional BGA semiconductor device having an interposer substrate.

Now, the present invention is more specifically described with reference to accompanying drawings, wherein similar constituent elements are designated by similar reference numerals to some extent.

Figure 2:
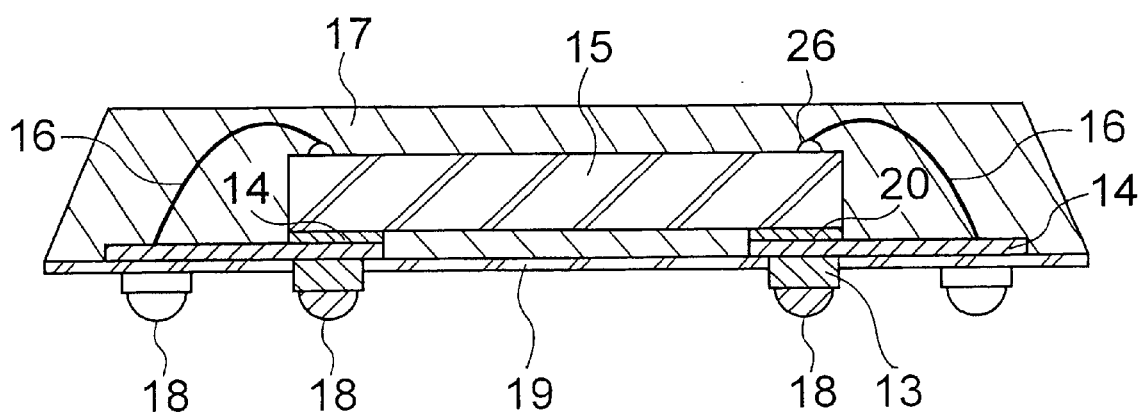
FIG. 2 is a sectional view of a semiconductor device according to an embodiment of the present invention.

Referring to FIG. 2, a semiconductor device according to an embodiment of the present invention includes a semiconductor chip 15 encapsulated by a transfer molding technique using a mold resin 17. The semiconductor chip 15 is fixed onto a metallic film pattern 14, or die pad, in the central area thereof, with the bottom of the semiconductor chip 15 fixed thereto using an insulating adhesive layer 20.

Each of the chip electrodes 26 formed on the semiconductor chip 15 is connected to a stitch area of the metallic film pattern 14 disposed at the outer side of the semiconductor chip 15. A plurality of land patterns 13 are disposed on the bottom surface of the metallic film pattern 14. The land patterns 13 are formed by patterning a metallic plate, and a solder ball 18 is formed on the bottom of each of the land patterns 13. An insulating adhesive layer 19 is formed by coating on the entire bottom surface of the semiconductor device except for the land patterns 13. By employing the structure wherein the semiconductor chip 15 is supported by the metallic interconnect pattern 14, the overall thickness of the final semiconductor device can be significantly reduced.

In an alternative, the land patterns 13 may be omitted, with the solder balls 18 disposed directly on the bottom of the metallic interconnect pattern 14, which further reduces the overall thickness of the final semiconductor device.

Some of the solder balls (first solder balls) 18 are disposed on the inner side of the metallic interconnect pattern 14 just below the semiconductor chip 15, whereas the others of the solder balls (second solder balls) 18 are disposed on the outer side of the metallic interconnect pattern 14 outside the semiconductor chip 15 as viewed on the bottom surface of the semiconductor device.

The first solder balls 18 and the second solder balls 18 are disposed alternately with each other. The first solder balls 18 are disposed just below the outer periphery of the semiconductor chip 15. The second solder balls 18 are disposed just below the stitch areas connected to the bonding wires 16. The alternate arrangement of the first solder balls 18 and the second solder balls 18 allows a smaller pitch of the solder balls 18 without interference therebetween.

Figure 3A:
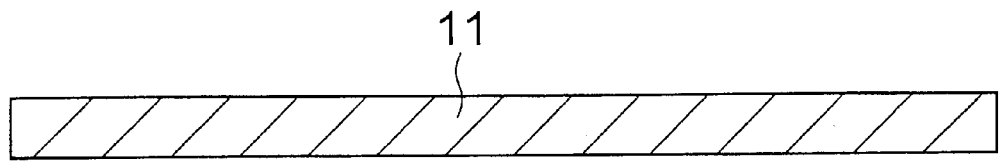
FIGS. 3A to 3D are sectional views of the frame substrate shown in of FIG. 2, showing consecutive steps of a method for fabrication thereof.
Figure 3B:
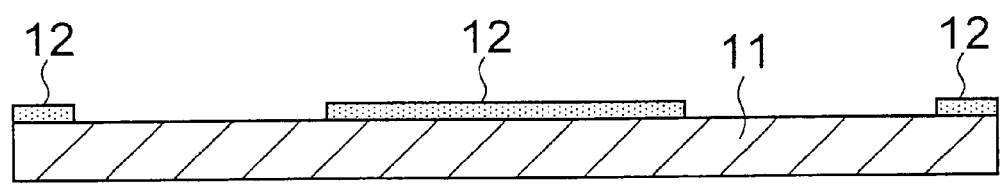
Figure 3C:
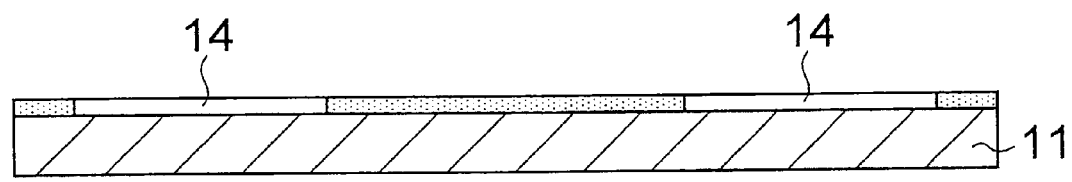
Figure 3D:
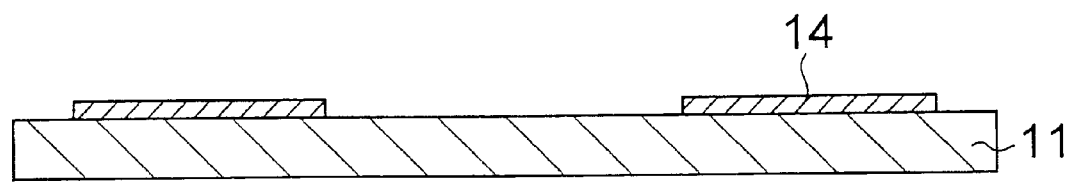

FIGS. 3A to 3D show a process for forming the frame substrate used for fabricating the semiconductor device of FIG. 2. In FIG. 3A, a metallic plate 11 is first prepared, on which a resist film 12 is formed by coating, followed by patterning thereof to form a negative resist pattern 12 which is negative with respective to a desired interconnect pattern, as shown in FIG. 3B. A metallic interconnect pattern 14 is then formed on the exposed surface of the metallic plate 11 by a plating technique, as shown in FIG. 3C, followed by removal of the negative resist pattern 12 to obtain a frame substrate wherein a metallic interconnect pattern 14 is formed on the metallic plate 11, as shown in FIG. 3D.

Figure 4A:
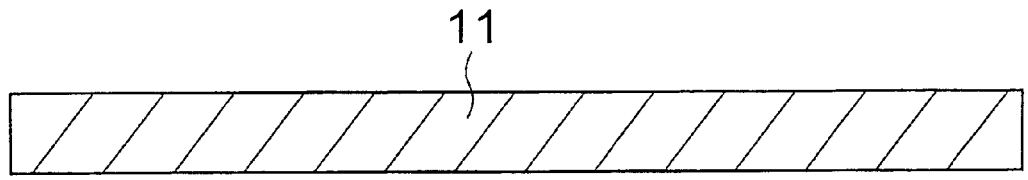
FIGS. 4A to 4D are sectional views of the frame substrate shown in FIG. 2, for showing consecutive steps of another method for fabrication thereof.
Figure 4B:
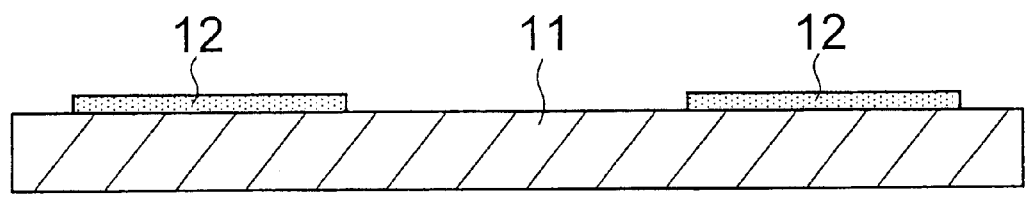
Figure 4C:
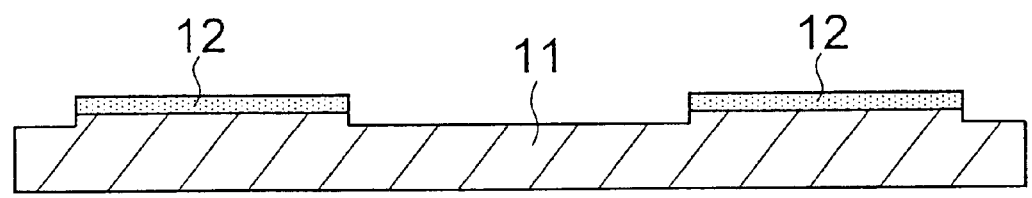
Figure 4D:
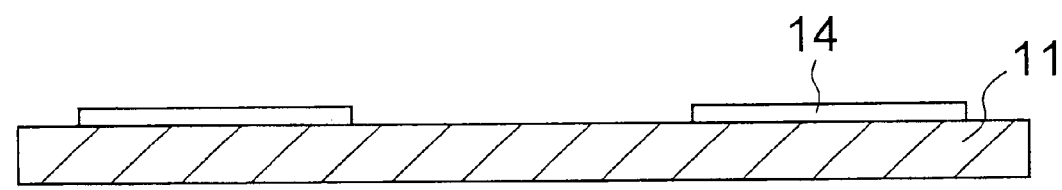

FIGS. 4A to 4D show another process for forming the frame substrate used for fabrication of the semiconductor device of FIG. 2. In FIG. 4A, a metallic plate 11 is first prepared, followed by forming thereon a positive resist pattern 12, which is positive with respect to a desired interconnect pattern. The metallic plate 11 is then etched using the positive resist pattern 12 as an etching mask, as shown in FIG. 4C, followed by removal of the positive resist pattern 12 from the metallic plate 11. Thus, a frame substrate 13 is obtained wherein a land pattern 14 is formed as a metallic interconnect pattern on the top surface of the metallic plate 11.

Figure 5A:
FIGS. 5A to 5G are sectional views of the semiconductor device of FIG. 2, showing consecutive steps of a method for fabrication thereof according to a first embodiment of the present invention.
Figure 5B:
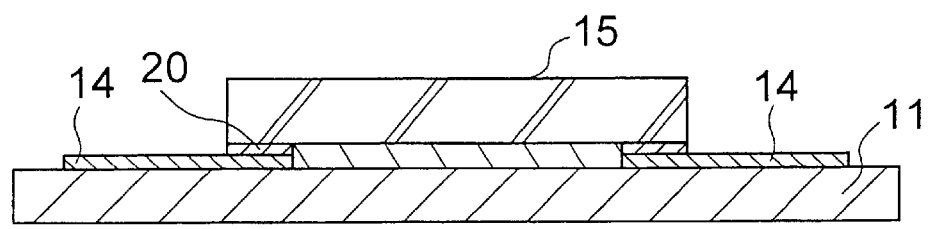
Figure 5C:
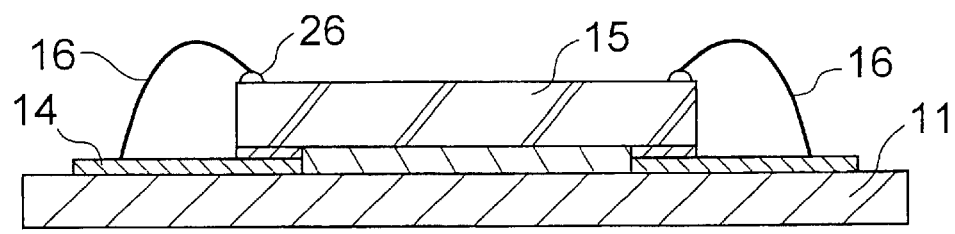
Figure 5D:
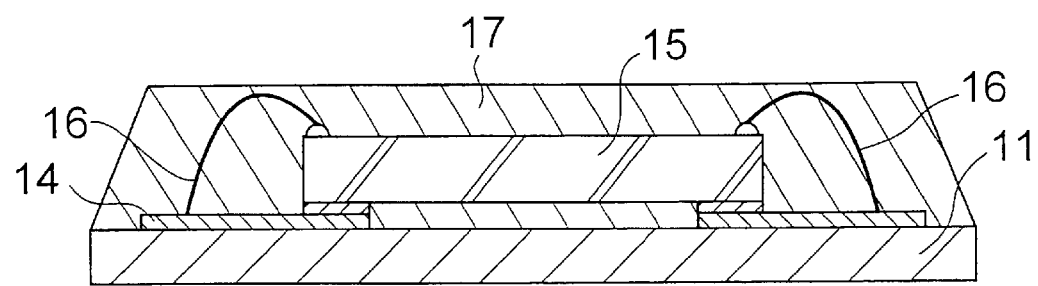

FIGS. 5A to 5G show a fabrication process for a semiconductor device according to a first embodiment of the present invention. In FIG. 5A, a frame substrate (or may be called temporary interposer substrate) wherein a metallic pattern 14 is formed on a metallic plate 11 is prepared by a process such as shown in FIGS. 3A to 3D. A semiconductor chip 15, the bottom of which is applied with adhesive 20, is mounted on the frame substrate, with the outer periphery of the semiconductor chip 15 being placed on the inner side of the metallic pattern 14 of the frame substrate, as shown in FIG. 5B. Subsequently, the chip electrodes 26 on the semiconductor chip 15 are electrically connected to the stitch areas disposed outer side of the metallic pattern 14 by bonding wires 16, as shown in FIG. 5C, followed by encapsulating the semiconductor chip 15 on the top surface of the frame substrate by a transfer molding technique using a mold resin 17.

Figure 5E:
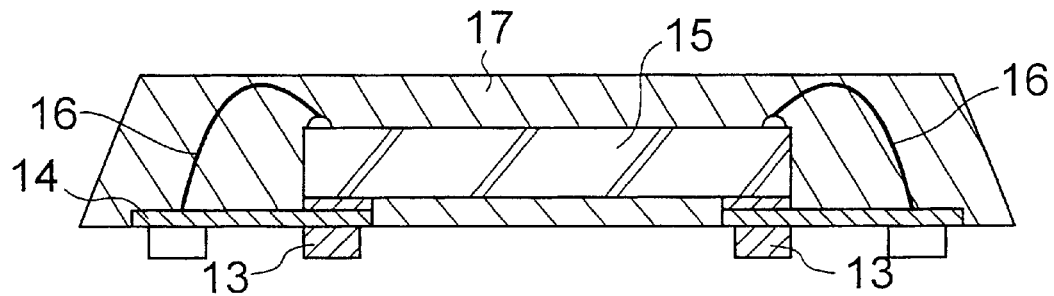

Thereafter, as shown in FIG. 5E, the metallic plate 11 of the frame substrate is removed at the bottom surface thereof by wet etching or a plasma etching, to leave land patterns 13 on the bottom surface of the metallic interconnect pattern 14. The land patterns 13 can be formed with ease at either the outer or inner side of the metallic interconnect pattern 14, whereby design choice for the locations of the land patterns 13 can be improved.

Figure 5F:
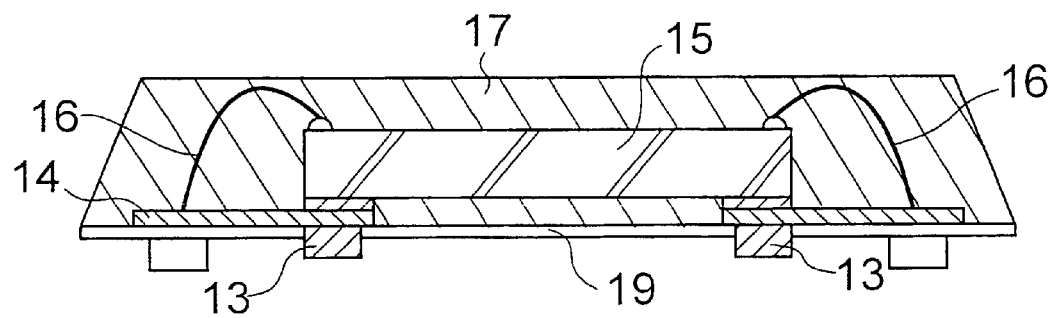
Figure 5G:
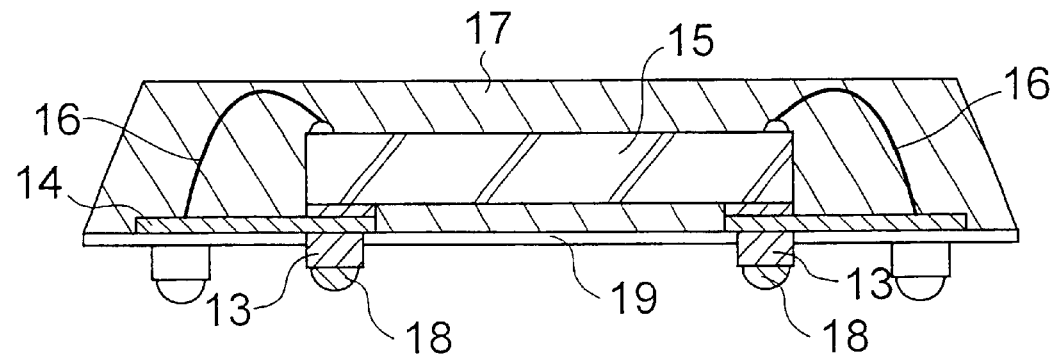

After the patterning of the metallic plate 11, an insulating adhesive is applied to the patterned surface to form an adhesive layer 19, through which the land patterns 13 penetrate, as shown in FIG. 5F. Then, a solder ball 18 is formed on each of the land patterns 13, to obtain the structure shown in FIG. 5G.

The solder balls 18 are disposed alternately at the inner side and at the outer side of the metallic pattern 14 in the present embodiment. In alternative, the solder balls 18 may be disposed in a checkered pattern on the bottom surface. This configuration allows the external terminals to be disposed in the substantially entire bottom area of the semiconductor device, thereby reducing the planar dimensions of the semiconductor device.

In the above process, the order of coating the insulating adhesive 19 and forming the solder balls 18 may be reversed from the recited order. In addition, the solder balls 18 may be omitted, with the terminals of the electronic appliances or parts directly mounting the land patterns 13 by using another known technique.

In a modification of the above process, the metallic plate 11 may be polished by a CMP process without leaving the land patterns 13. In this case, the solder balls 18 may be formed directly on the bottom surface of the metallic interconnect pattern 14.

Figure 6A:
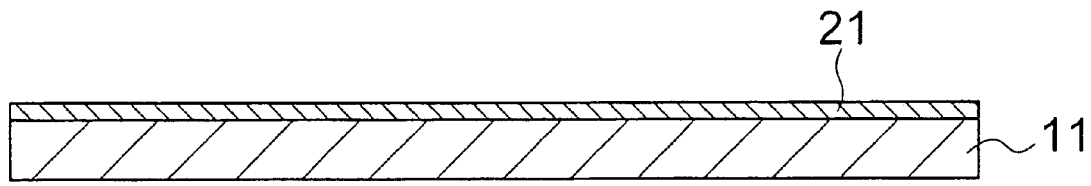
FIGS. 6A to 6G are sectional views of a semiconductor device, showing consecutive steps of a method for fabrication thereof according to a second embodiment of the present invention.
Figure 6B:
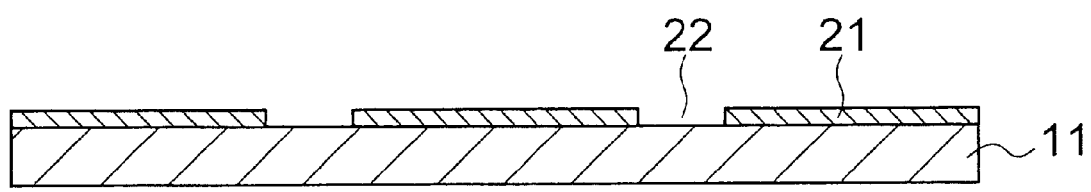

FIGS. 6A to 6G consecutively show another process for fabrication of a semiconductor device according to a second embodiment of the present invention. The process includes the steps of forming the frame substrate. In FIG. 6A, an insulating adhesive layer 21 is formed on a metallic plate 11 by coating, followed by patterning thereof to form openings 22 in the adhesive layer 21, as shown in FIG. 6B. The openings 22 which are to receive therein solder balls are arranged in a row underlying the outer periphery of the semiconductor chip to be placed, and another row outside the area mounting thereon the semiconductor chip. Two rows of the openings 22 are disposed in a staggered arrangement.

Figure 6C:
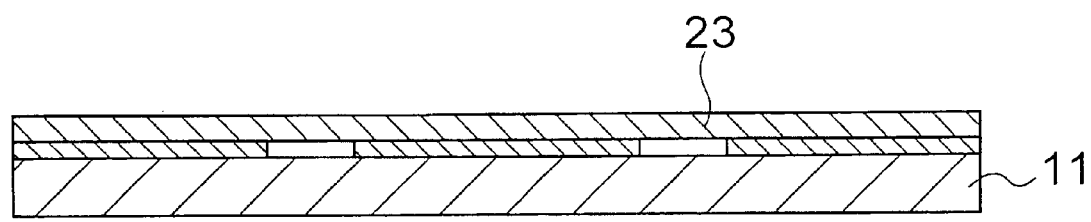
Figure 6D:
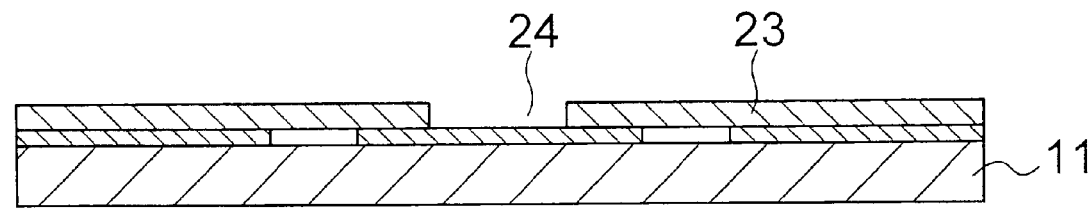

Thereafter, a metallic film 23 is adhered onto the insulating adhesive layer 21, as shown in FIG. 6C, followed by patterning of the metallic film 23 to form therein a central opening 24 as well as to form a metallic interconnect pattern therefrom, as shown in FIG. 6D.

Figure 6E:
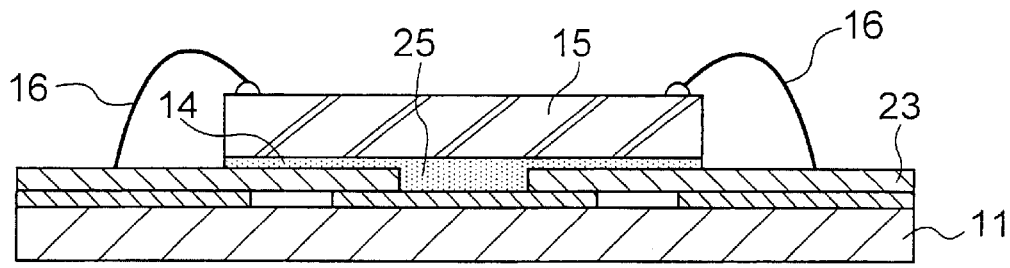

An insulating adhesive 25 is then applied in the central opening 22, and a semiconductor chip 15 having a bottom onto which a similar insulating adhesive 25 is applied is placed on the metallic interconnect pattern 23 so that the center of the semiconductor chip 15 is aligned with the center of the central opening 22. After curing the insulating adhesive 25, the chip electrodes 26 on the semiconductor chip 15 are electrically connected to the metallic interconnect pattern 23 by bonding wires 16, as shown in FIG. 6E.

Figure 6F:
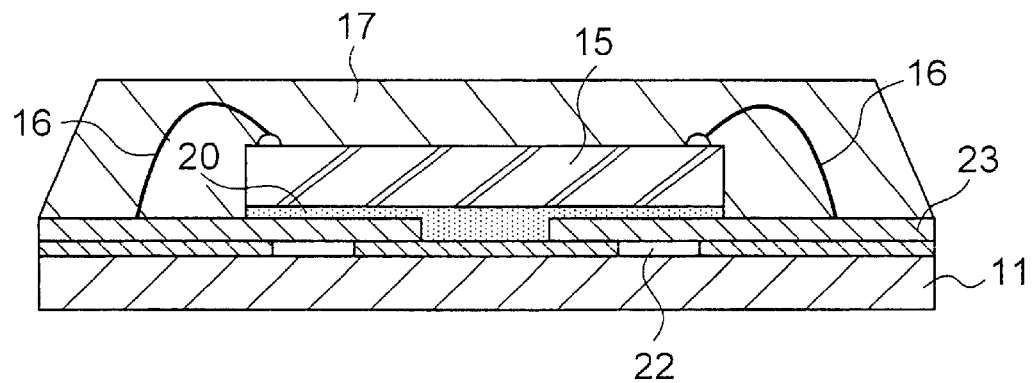
Figure 6G:
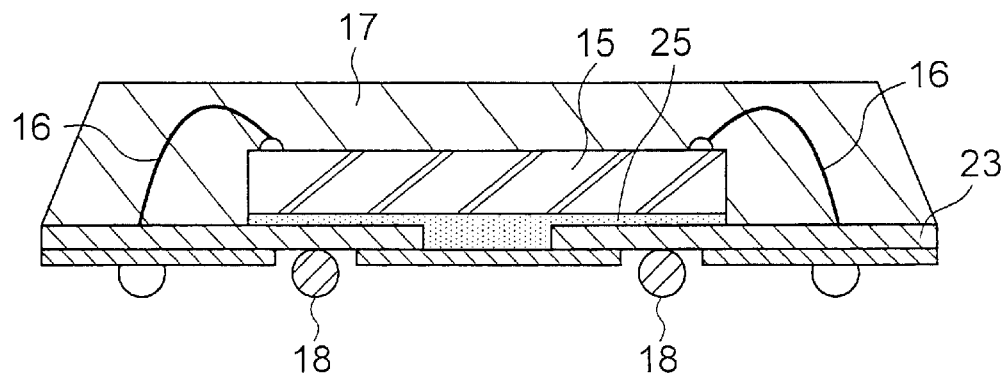

Thereafter, the semiconductor chip 15 is encapsulated on top of the metallic interconnect pattern 23 and the insulating film 11 by a transfer molding using a mold resin 17, as shown in FIG. 6F. Then, the metallic plate 11 is removed by etching, such as chemical etching using an etchant, plasma etching, chemical-mechanical polishing (CMP) using an abrasive etc. Further, a solder ball 18 is formed through each of the openings 22 on the bottom of the metallic interconnect pattern 23, as shown in FIG. 6G. The solder balls 18 are disposed in a staggered arrangement or alternately at the inner side and the outer side of the metallic interconnect pattern 23.

In the above embodiment, the formation of the solder ball 18 through the opening 22 can be conducted more easily compared to the first embodiment. In addition, removal of the step of forming the insulating adhesive layer after the removal of the metallic plate 11 reduces the number of steps for the fabrication. It is to be noted that the arrangement of the solder balls 18 in the present embodiment of the present invention is a mere example, and may be modified therefrom.

Figure 7A:
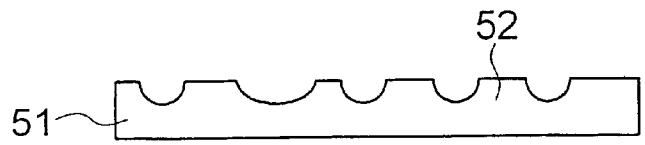
FIGS. 7A to 7F are sectional views of a semiconductor device, showing consecutive steps of a method for fabrication thereof according to a third embodiment of the present invention.

FIGS. 7A to 7F consecutively show a method for fabricating a semiconductor device according to a third embodiment of the present invention. In FIG. 7A, a metallic plate, or Cu plate, 51 is subjected to etching the top surface thereof to form an interconnect pattern 52, which includes a pattern portion acting as a support member for supporting a semiconductor chip. The pattern portion is located at the central area of the Cu plate 51.

Figure 7B:
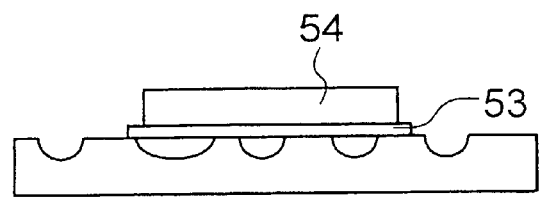
Figure 7C:
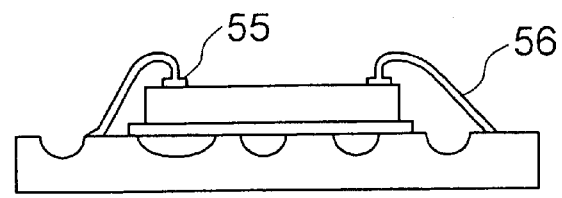
Figure 7D:
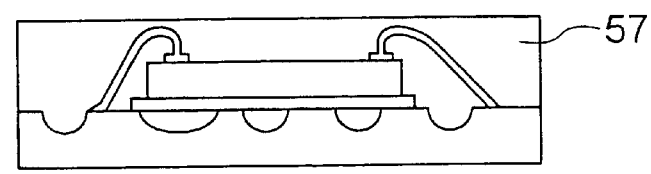

Subsequently, an insulating adhesive 53 is applied onto the top of the Cu plate 52 at the central pattern portion, followed by mounting thereon a semiconductor chip 54 to be adhered, as shown in FIG. 7B. Chip electrodes 55 on the semiconductor chip 54 are connected to the interconnect pattern 52 by bonding wires 56, as shown in FIG. 7C. Subsequently, a transfer molding process is performed using a mold resin 57 for encapsulation of the semiconductor chip 54 as well as the bonding wires 56 onto the top of the Cu plate 51, as shown in FIG. 7D.

Figure 7E:
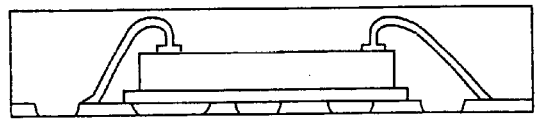
Figure 7F:
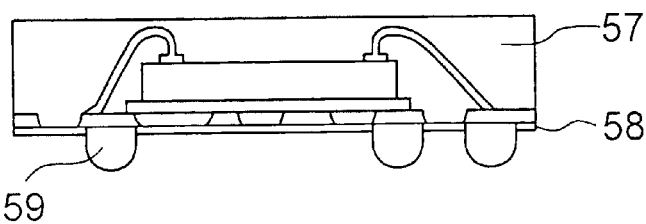
Figure 8A:
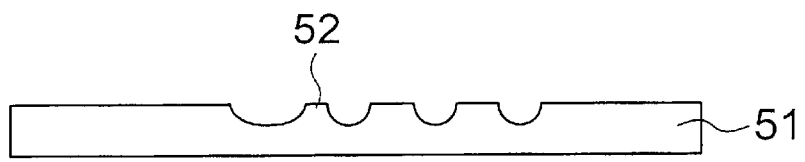
FIGS. 8A to 8F are sectional views of a semiconductor device, showing consecutive steps of a method for fabrication thereof according to a fourth embodiment of the present invention.
Figure 8B:
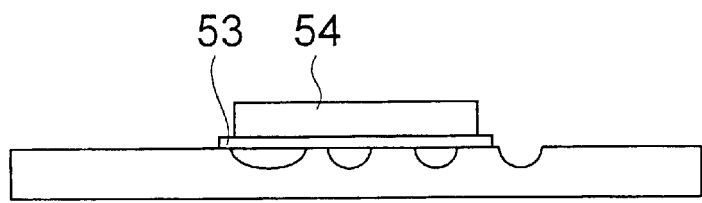
Figure 8C:
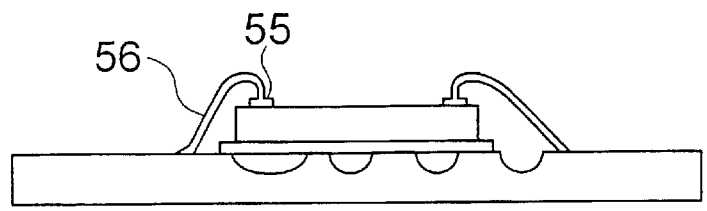
Figure 8D:
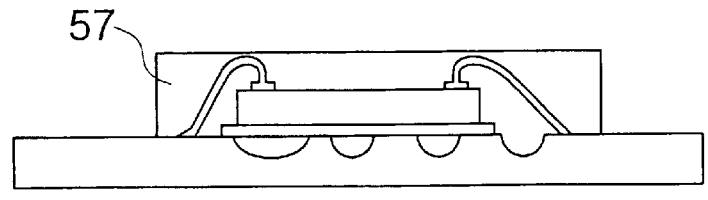
Figure 8E:
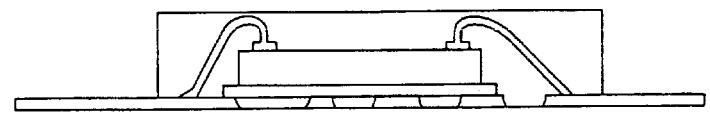
Figure 8F:
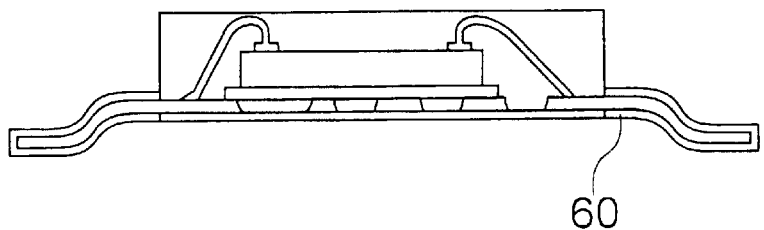

Thereafter, the Cu plate 51 is subjected to polishing at the bottom surface thereof to remove the portion of the Cu plate other than the interconnect pattern 52, as shown in FIG. 7E. An insulating sheet 58 is then adhered onto the interconnect pattern 52 at the bottom thereof, followed by forming metallic bumps 59 on the interconnect pattern 52, metallic bumps 59 penetrating the insulating sheet 58 at throughholes, as shown in FIG. 7G. The metallic bumps 59 are located just below the periphery of the semiconductor chip 54 as well as outside the semiconductor chip 54.

In the above embodiment, the interconnect pattern 52 is formed directly from the top of the Cu plate 51. In an alternative, the interconnect pattern may be formed by the steps of forming grooves having a positive pattern for an interconnect pattern on the a metallic plate, and filling the grooves with a metallic plating film by using a electrolytic plating technique. The metallic plate is later removed by polishing and a selective wet etching at the bottom thereof.

FIGS. 8A to 8F consecutively show a method for fabricating a semiconductor device according to a fourth embodiment of the present invention. This embodiment is similar to the third embodiment except that the central portion of the metallic pattern 52 is used solely to support the semiconductor chip in the present embodiment, and the peripheral portion of the metallic pattern 52 is used as external electrodes and has a somewhat larger thickness for mechanical strength after the polishing thereof. The peripheral portion of the metallic pattern 52 is mechanically configured and subjected to coating for forming an insulation film 60 thereon at the final step of fabrication. The peripheral portion is used as external lead wires.

Figure 9A:
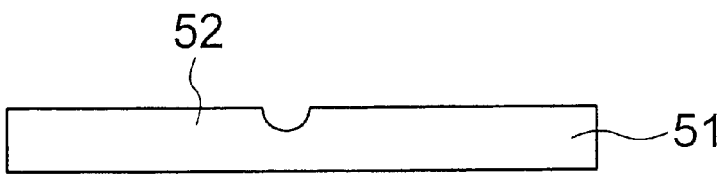
FIGS. 9A to 9F are sectional views of a semiconductor device, showing consecutive steps of a method for fabrication thereof according to a fifth embodiment of the present invention.
Figure 9B:
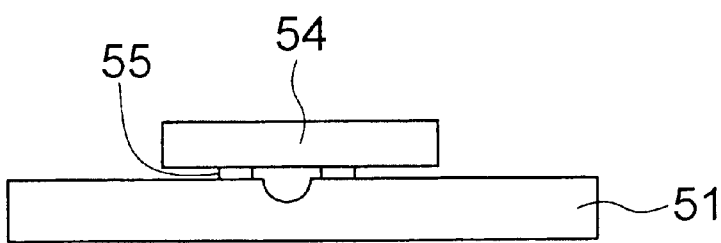
Figure 9C:
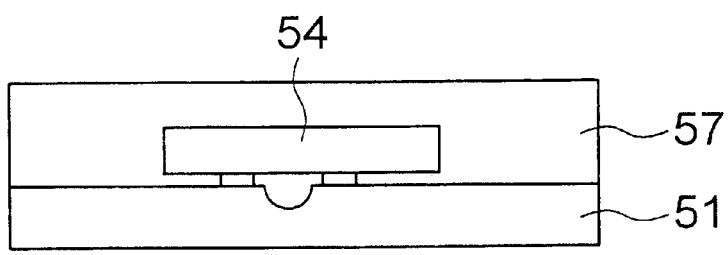
Figure 9D:
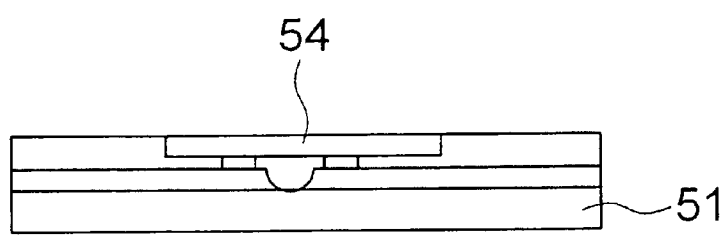
Figure 9E:
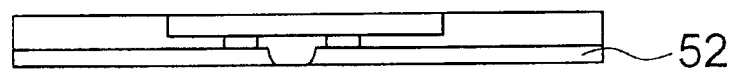
Figure 9F:
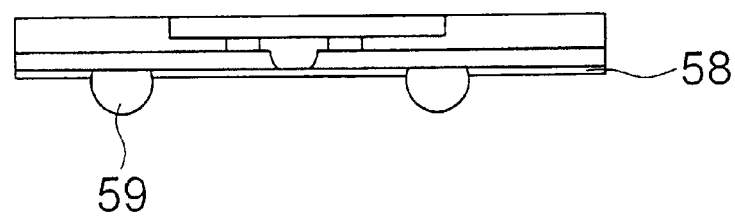
Figure 10A:
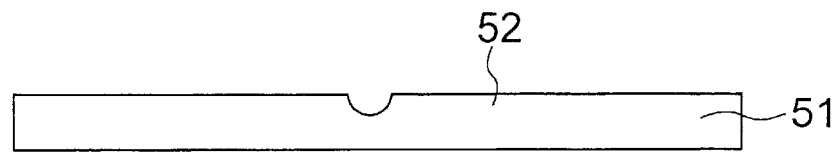
FIGS. 10A to 10F are sectional views of a semiconductor device, showing consecutive steps of a method for fabrication thereof according to a sixth embodiment of the present invention.
Figure 10B:
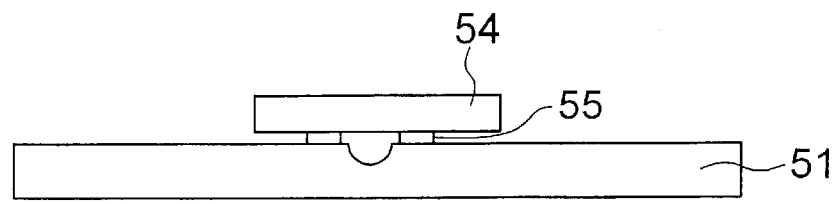
Figure 10C:
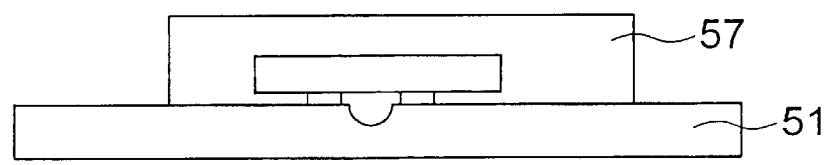
Figure 10D:
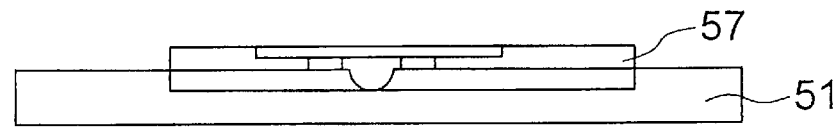
Figure 10E:
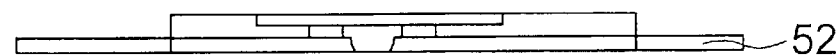
Figure 10F:
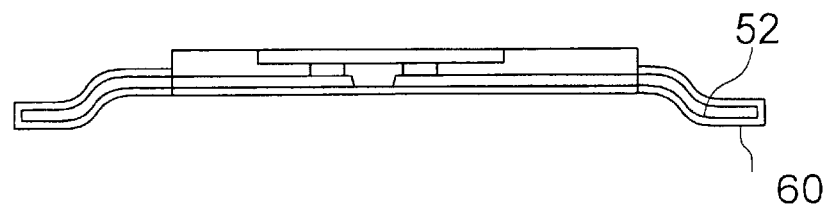
Figure 11A:
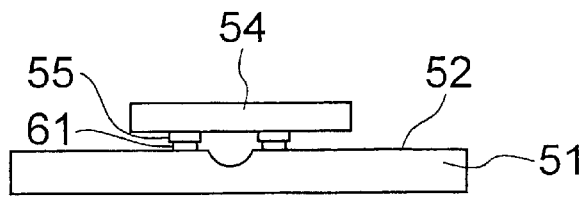
FIGS. 11A to 11D are sectional views of a semiconductor device, showing consecutive steps of a method for fabrication thereof according to a seventh embodiment of the present invention.
Figure 11B:
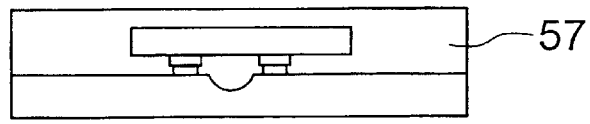
Figure 11C:
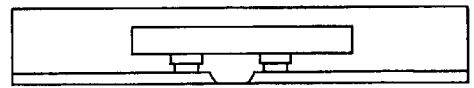
Figure 11D:
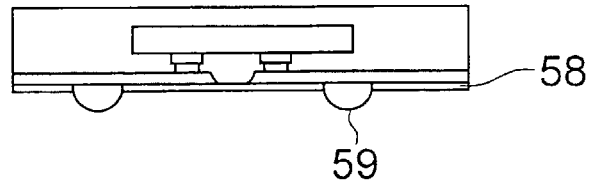
Figure 12A:
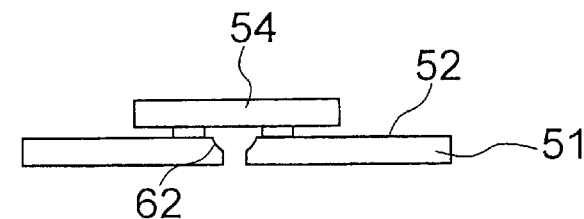
FIGS. 12A to 12D are sectional views of a semiconductor device, showing consecutive steps of a method for fabrication thereof according to an eighth embodiment of the present invention.
Figure 12B:
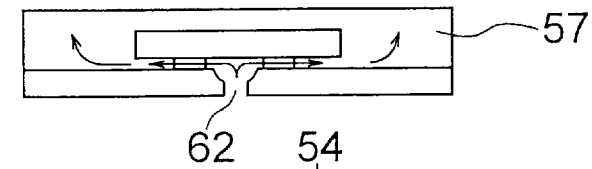
Figure 12C:
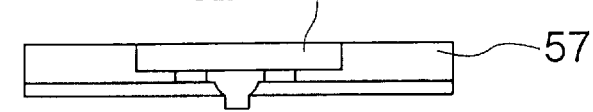
Figure 12D:
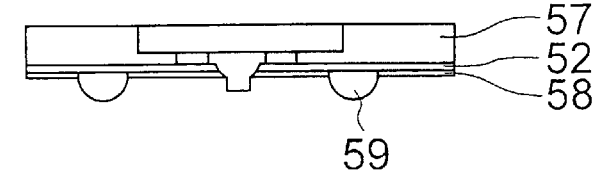

FIGS. 9A to 9F consecutively show a method for fabricating a semiconductor device according to a fifth embodiment. In FIG. 9A, an interconnect pattern 52 is formed on a metallic plate 51 by etching. A semiconductor chip 54 having a face-down structure is mounted on the metallic plate 51, with the chip electrodes 55 on the semiconductor chip 54 being in contact with the interconnect pattern 52, as shown in FIG. 9B. After encapsulating the semiconductor chip 54 on the metallic plate 51 by using a mold resin 57 as shown in FIG. 9C, the top portion of the mold resin 57 as well as the top portion of the semiconductor chip 54 is removed by mechanical grinding, as shown in FIG. 9D. The bottom of the metallic plate 51 is also removed by mechanical grinding to leave the interconnect pattern 52 as shown in FIG. 9E, followed by adhering an insulating sheet 58 on the bottom of the interconnect pattern 52 and forming metallic bumps 59 thereon, as shown in FIG. 9F.

FIGS. 10A to 10F consecutively show a method for fabricating a semiconductor device according to a sixth embodiment of the present invention. The present embodiment is similar to the fifth embodiment except that the interconnect pattern 52 is used as external terminals lead wires in the present embodiment similarly to the fourth embodiment.

FIGS. 11A to 11D show a method for fabricating a semiconductor device according to a seventh embodiment of the present invention. The seventh embodiment is similar to the fifth embodiment except that metallic bumps 61 are provided on the chip electrodes 55 of the semiconductor chip 54 for connection with the interconnect pattern 52 on the metallic plate 51 in the present embodiment.

FIGS. 12A to 12D consecutively show a method for fabricating a semiconductor device according to an eighth embodiment of the present invention. The present embodiment is similar to the sixth embodiment except that an injection hole 62 is formed in the center of the metallic plate 51 in the present embodiment. The injection hole 62 is formed before or after forming the interconnect pattern 52 and used later for injection of mold resin.

Figure 13:
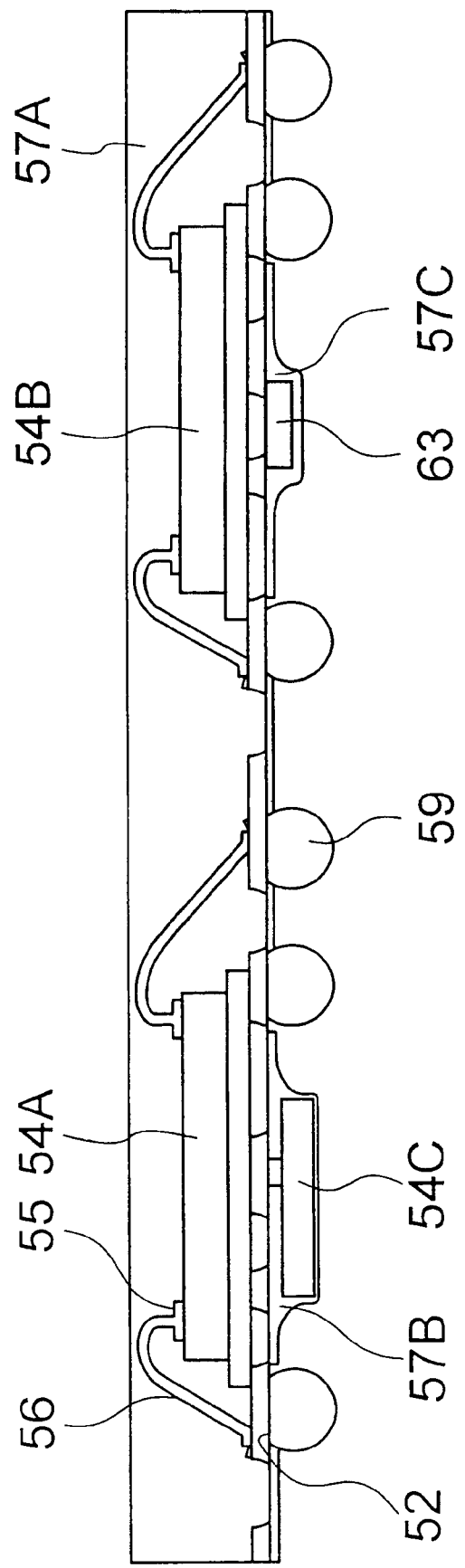
FIG. 13 is a sectional view of a semiconductor device according to another embodiment of the present invention.

Referring to FIG. 13, a semiconductor device according to another embodiment of the present invention includes first and second semiconductor chips 54A and 54B mounted on the top of an interconnect pattern 52 and encapsulated by a common mold resin 57A. In addition, a third semiconductor chip 54C is mounted on the bottom of the interconnect pattern 52, opposing the first semiconductor chip 54A. The third semiconductor chip 54C is encapsulated by another mold resin 57B. A fourth semiconductor chip 54D is mounted and encapsulated by another mold resin 57C similarly to the semiconductor chip 54C, opposing to the second semiconductor chip 54B.

In each of the above embodiments, the interconnect pattern 52 is formed directly on the metallic plate 51 by etching the top of the metallic plate 51. In the removal step for the metallic plate 51 at the bottom thereof by using an etching, an over-etching may occur wherein the metallic interconnect pattern 52 is also removed. Thus, for the etching step for removing the metallic plate 51, it is preferable that the metallic interconnect pattern 52 and the metallic plate 51 are made of different metals. In this case, the metallic plate 51 can be removed by a wet etching step selectively from the metallic interconnect pattern 52. In an alternative, for the metallic plate 51 and the metallic interconnect pattern 52 made of the same metal, either of the metallic plate 51 and the metallic interconnect pattern 52 is added with an additive so that both have different etching rates in a common etchant.

Figure 14:
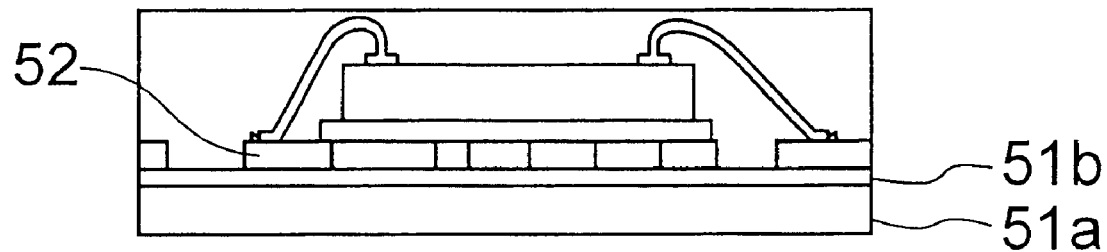
FIG. 14 is a sectional view of a semiconductor device according to another embodiment of the present invention.

Referring to FIG. 14 a semiconductor device according to another embodiment of the present invention includes a metallic plate 51 having a bottom layer 51a made of a first metal and a top layer 51b made of a second metal. The metallic interconnect pattern 52 is also made of the first metal. The first metal and the second metal can be etched by using different etchants. After the bottom layer 51a is etched by a first etchant, the top layer is etched by a second etchant selectively from the metallic interconnect pattern 52. The metallic interconnect pattern 52 may have at the bottom thereof another metallic film for enhancing the rigidity.

Figure 15:
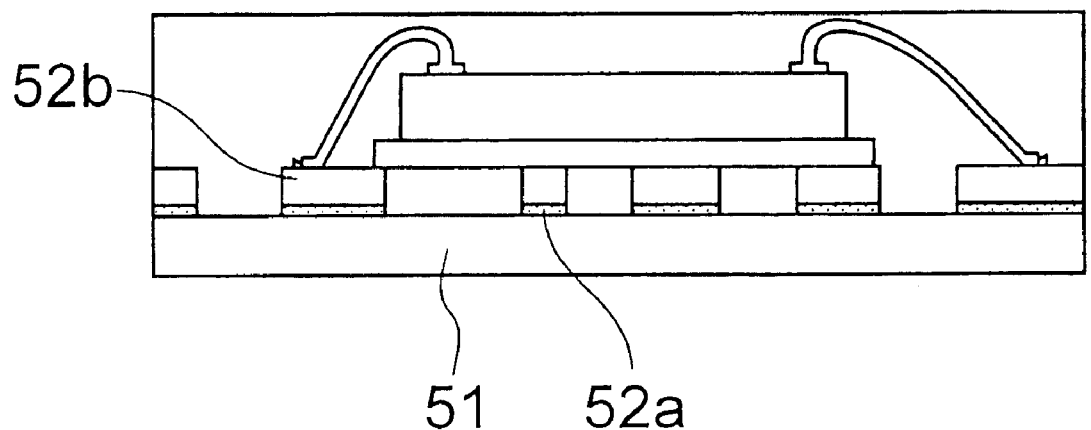
FIG. 15 is a sectional view of a semiconductor device according to another embodiment of the present invention.

Referring to FIG. 15, a semiconductor device modified from the embodiment of FIG. 14 includes a single metallic plate 51 made of a first metal, a metallic interconnect pattern 52 including a thin bottom layer 52a made of a second metal and a thick top layer 52b made of a third metal. The second and third metals are formed by an electrolytic plating technique, for example. The electrolytic plating technique is superior to the electroless plating technique in view of a lower cost and a higher impurity of the resultant film. The higher impurity provides a superior connection capability.

In FIG. 15, the metallic plate 51 can be removed by chemical etching, physical (chemical-mechanical) polishing, mechanical grinding, mechanical peeling-off etc. The mechanical peeling-off may be associated with provision of different metals having different coefficients of thermal expansion or different melting points.

In each of the above embodiments, the metallic plate or layer may be made of Cu, Ni or Fe, for example. The adhesive or mold resin may preferably include a thermo-curable epoxy resin as the main component thereof. As the external terminals, solder balls can be used which include Sn and Pb as the main components thereof.

If the metallic interconnect pattern is formed by an electrolytic plating technique, the frame substrate as used in the embodiments of the present invention has an advantage over the conventional interposer substrate, as will be detailed below.

The metallic interconnect pattern formed by the electrolytic plating technique generally has a higher impurity and achieves a superior connection capability. In the conventional interposer substrate including a resin substrate and a metallic interconnect pattern, the metallic interconnect pattern can be formed by the electrolytic plating technique by using an electrode layer formed on the resin substrate. In this case, the electrode layer must extend to the outer periphery of the resin substrate for supplying electricity during the plating. Thus, the metallic interconnect pattern is formed on the periphery at which the interconnect pattern is not needed. The metallic interconnect pattern formed on the periphery may be exposed at the surface of the mold resin to be subjected to ingress of water. This deteriorates the insulation characteristics or corrosion of the metallic interconnect pattern in the resultant semiconductor device. On the other hand, the metallic interconnect pattern in the present invention can be formed by the electrolytic plating technique at the desired location on the metallic plate. This prevents deterioration or corrosion as encountered in the conventional interposer substrate.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising:

a semiconductor chip having a plurality of chip electrodes thereon;

a metallic interconnect pattern having a top surface connected to said plural chip electrodes and supporting said semiconductor chip, at least a top portion of said metallic interconnect pattern being formed by an electrolytic plating technique;

an insulating film covering a bottom surface of said metallic interconnect pattern and having through-holes therein;

a plurality of external terminals formed on said bottom surface of said interconnect pattern in said through-holes;

a mold resin encapsulating said semiconductor chip on said top surface of said metallic interconnect pattern and said insulating film;

another semiconductor chip mounted on said bottom surface of said metallic interconnect pattern; and another mold resin encapsulating said another semiconductor chip on said bottom surface of said metallic interconnect pattern.

* * * * *